(12) United States Patent
Lin et al.

(10) Patent No.: US 8,411,483 B2
(45) Date of Patent: Apr. 2, 2013

(54) TESTING ONE TIME PROGRAMMING DEVICES

(75) Inventors: Sung-Chieh Lin, Hsinchu (TW); Kuoyuan (Peter) Hsu, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 204 days.

(21) Appl. No.: 12/833,131

(22) Filed: Jul. 9, 2010

(65) Prior Publication Data

US 2011/0007542 A1    Jan. 13, 2011

Related U.S. Application Data

(60) Provisional application No. 61/224,677, filed on Jul. 10, 2009.

(51) Int. Cl.
*G11C 17/00*    (2006.01)
(52) U.S. Cl. .............. 365/96; 365/94; 365/201; 714/720
(58) Field of Classification Search .................. 714/720; 365/94–105, 201
See application file for complete search history.

(56) References Cited

U.S. PATENT DOCUMENTS

| | | | | |
|---|---|---|---|---|
| 4,429,308 A | * | 1/1984 | Shankle | 324/660 |
| 6,407,953 B1 | * | 6/2002 | Cleeves | 365/201 |
| 7,619,914 B2 | * | 11/2009 | Ito | 365/96 |
| 7,725,844 B2 | * | 5/2010 | Aipperspach et al. | 716/106 |
| 7,817,455 B2 | * | 10/2010 | Fredeman et al. | 365/96 |

* cited by examiner

*Primary Examiner* — Tuan T Nguyen
*Assistant Examiner* — Lance Reidlinger
(74) *Attorney, Agent, or Firm* — Lowe Hauptman Ham & Berner, LLP

(57) ABSTRACT

A one time programming (OTP) memory array is divided into a user section and a test section. The cells in the user section and in the test section are configured to form a checkerboard pattern, that is, having repeats of one user cell and one test cell in both column and row directions. Programming the test section and various additional tests are performed to both the user and test sections and other circuitry of the memory array while the user section is not programmed. Even though the OTP user section is not programmed or tested, the provided tests in accordance with embodiments of the invention can provide a very high probability that the OTP memory including the user section is of high quality, i.e., the OTP cells in the user section can be programmed and function appropriately.

20 Claims, 3 Drawing Sheets

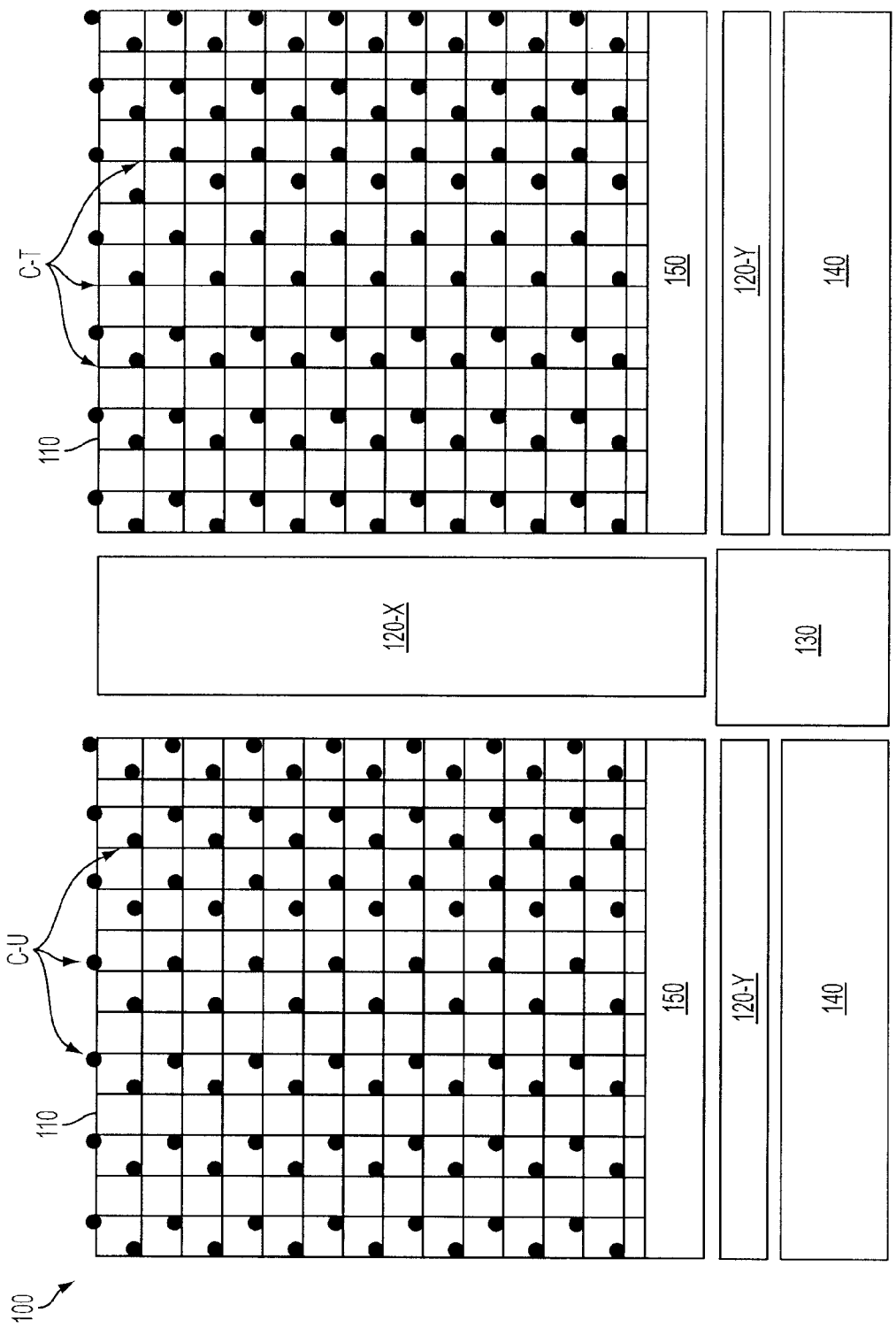

TESTING ONE TIME PROGRAMMING DEVICES

CROSS-REFERENCE TO RELATED APPLICATIONS

The present application claims priority of U.S. Provisional Patent Application Ser. No. 61/224,677, filed on Jul. 10, 2009, which is incorporated herein by reference in its entirety.

TECHNICAL FIELD

The present disclosure is generally related to one time programming (OTP). Various embodiments provide mechanisms to test OTP memory cells for use in automotive-grade applications.

BACKGROUND

Generally, a semiconductor device is tested to verify that it performs its intended functions before being shipped to a customer. For example, a memory is tested by writing various low and high data and reading back the data to verify the memory can store and provide the intended data. Testing OTP devices (e.g., OTP memory) is challenging because after an OTP cell of the memory is programmed, it cannot be reversed or reprogrammed. Stress testing OTP devices is also difficult. In a stress test, a device is generally subject to a combination of high temperature, high voltage and/or high current, which can cause the OTP device to be irreversibly programmed.

Requirement for testability and reliability for consumer products is normally less stringent than that for automotive-grade products. As a result, OTP devices for use in consumer products are generally tested to meet such general consumer product standards, which in many cases do not meet those of automotive-grade products.

SUMMARY

Various embodiments of the disclosure are related to OTP. In an embodiment related to an OTP memory array, the array is divided into a user section and a test section. The cells in the user section and in the test section are configured to form a checkerboard pattern, e.g., repeats of one user cell and one test cell in both column and row directions. Programming the test section and various additional tests are performed to both the user and test sections and other circuitry of the memory array while the user section is not programmed. Even though the OTP user section is not programmed or tested, the provided tests in accordance with various embodiments of the disclosure can provide a very high probability that the OTP memory including the user section is of high quality, i.e., the OTP cells in the user section can be programmed and function appropriately.

Various embodiments of the disclosure can have one or a combination of the following features and/or advantages. Various embodiments provide testability and reliability for OTP memory at a very high standard, and the memory therefore can be used in automotive grade applications if desire.

BRIEF DESCRIPTION OF THE DRAWINGS

The details of one or more embodiments of the disclosure are set forth in the accompanying drawings and the description below. Other features and advantages of the disclosure will be apparent from the description, drawings, and claims.

FIG. 1 shows a memory array upon which embodiments of the invention may be implemented.

Like reference symbols in the various drawings indicate like elements.

DETAILED DESCRIPTION

Figure 2A:
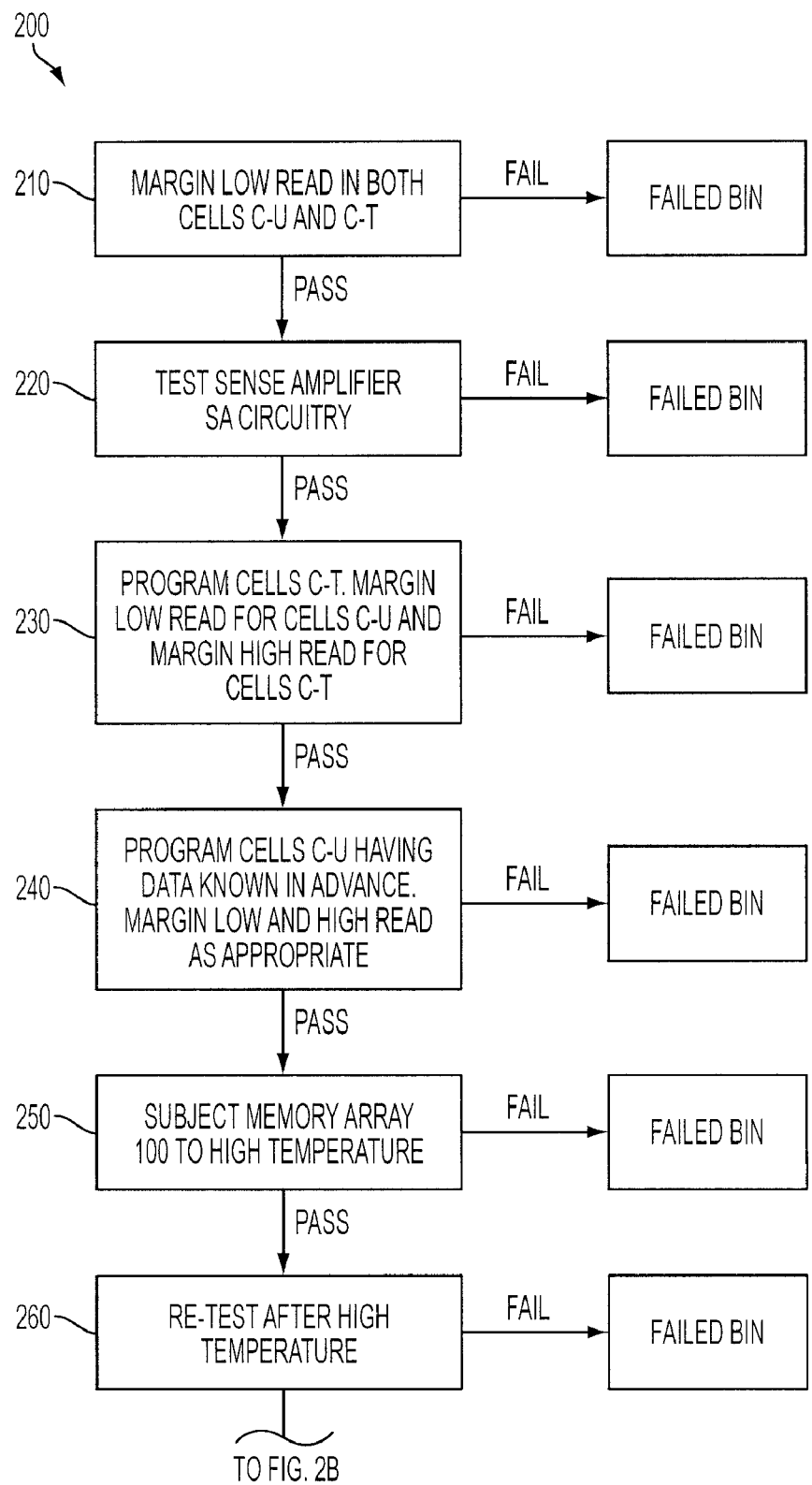
FIG. 2 shows a flowchart illustrating a method embodiment.

Various embodiments, or examples, of the disclosure illustrated in the drawings are now described using specific language. It will nevertheless be understood that no limitation of the scope of the invention is thereby intended. Any alterations and modifications in the described embodiments, and any further applications of principles described in this document are contemplated as would normally occur to one skilled in the art to which the disclosure relates. Reference numbers may be repeated throughout the embodiments, but this does not necessarily require that feature(s) of one embodiment apply to another embodiment, even if they share the same reference number.

The Memory Array

FIG. 1 shows a memory array 100 upon which embodiments of the disclosure may be implemented. Memory array 100 includes various circuitries known in the art, including the main array 110, decoder circuitry 120, control circuitry 130 and sense amplifiers 140. Sense amplifier test circuitry 150 in various embodiments is to test sense amplifiers 140.

In an embodiment, array 100 includes a plurality of cells C (not labeled) wherein the logic state of data in a memory cell C is based on a logic state of an electrical fuse (e.g., an eFuse) in the cell C. If an eFuse (e.g., the resistance R of the eFuse) is low then the memory cell C is considered as storing a low and if the eFuse is high then the memory cell C is considered storing a high. In an embodiment, when array 100 is first manufactured, all cells C of array 100 are low, i.e., resistance R (not labeled) of all cells C is low. Programming a cell C of array 100 refers to applying appropriate current and voltage to the cell C so that its resistance R is high. In an embodiment, array 100 is OTP (one time programming). That is, once a cell C of array 100 is programmed, it cannot be reversed or reprogrammed.

Depending on applications, some cells C of array 100 are programmed, which, together with un-programmed cells C, perform some particular functions and/or provide some desired features. In various applications, user programming does not occur long after memory array 100 has left its manufacturer, e.g., TSMC (Taiwan Semiconductor Manufacturing Company), for example. For further example, memory array 100 is shipped to a car dealer (or car manufacturer) and will not be programmed until, for example, a buyer of a car who requests a particular feature for the car. At that time the car dealer or manufacturer can program memory array 100 to perform the particular function requested by the car buyer. For illustration purposes, cells C that are to be programmed by a customer (e.g., user, car manufacturer, car dealer, etc.) are referred to as user cells C-U. Even though, user cells C-U of array 100 are not programmed when it leaves its manufacturer, various embodiments of the disclosure provide mechanisms such that these cells C-U can be successfully programmed and function accordingly at the car manufacturer or car dealer, for example.

In an embodiment, the main array 110 is divided into a user section 110-U (not labeled) and a test section 110-T (not labeled). User section 110-U includes a plurality of cells C-U each of which is represented by a dot in FIG. 1. Test section 110-T includes a plurality of cells C-T each of which is represented by an intersection between a horizontal line and a vertical line in FIG. 1. In various embodiments of the disclosure, cells C-U and cells C-T are configured to form a checkerboard pattern. That is cells C-U and cells C-T are alternating. Alternatively expressing memory array 100 includes repeats of one cell C-U and one cell C-T in both horizontal and vertical directions.

In many applications memory array 100 is shipped to a customer (e.g., car dealer or manufacturer) without user section 110-U being programmed so that the customer may program array 100 (e.g., user section 110-U) as he/she desires. The user may or may not know that memory array 100 includes a test section 110-T and a user section 110-U, but they have access to and thus can program user section 110-U.

For simplicity, decoder circuitry 120 includes X-decoder or row-decoder 120-X and Y-decoder or column-decoder 120-Y. Decoder circuitry 120 and control circuitry 130 may be referred to as peripheral circuitry.

Circuitry 150 in various embodiments of the disclosure is configured to test sense amplifiers SA 140. In an embodiment, circuitry 150 includes a row of resistance cells and sense amplifiers SA 140 are configured to sense such resistance. Depending on the provided value of the resistance, sense amplifiers SA 140 are to detect a high, a low, or to measure this provided (and thus known) resistance value.

Different Types Of Test

Generally, an electronic product is manufactured having one or various PC (printed circuit) boards, which include various packaged chips containing the die of the underlying devices (e.g., the die of memory array 100, of a CPU, etc.). The dice are initially made of semiconductor material (e.g., Silicon, Germanium, etc.) in the form of a wafer having various dice. The dice are then severed from the wafer and put into a chip housing (e.g., packaged). A packaged chip generally includes IO (input/output) pins for the die of the underlying device to interface with other devices or circuitry.

Depending on applications, memory array 110 may be tested with one or a combination of tests, including, for example, on-product test, on-board test, package (or final) test, high temperature baking, verification after high temperature, circuit probe (CP) test, etc.

A circuit probe test is also known as wafer test wherein a device (e.g., memory array 100) is tested when the semiconductor die of the device (e.g., memory array 100) is still part of a wafer.

Baking indicates the device is subject to a high temperature environment, e.g., 150 C in an embodiment. Usually baking is referred to as pre-stress test.

Final test indicates memory array 100 is tested after the array 100 is severed from the wafer and packaged into a semiconductor housing (e.g., chip). The term "final" is commonly used because after this packaged test, the semiconductor device may be shipped to a customer.

On-board test indicates memory array 100 is tested when the semiconductor chip embodying the array 100 is built on a printed circuit board.

On-product test indicates the memory array 100 is tested when it has been built into a product (e.g., a PDA, a GPS, a cell phone, etc.).

BISTR (built-in self test with redundant circuitry) known in the art is a mechanism that permits a circuit to test and thus verify some of its function. If an element, (e.g., a bit, a cell) is not functional then the BISTR engine uses provided redundant circuit to replace (and thus fix) the erroneous element. Various embodiments of the disclosure provide a BISTR engine in the system using memory array 100 to fix an error as appropriate. Those skilled in the art will recognize that BISTR can provide a good coverage for single bit failures.

ECC (error correction code) is generally built in the data path of a memory (e.g., memory array 100), and provides corrective actions if it detects a failure. Various embodiments of the disclosure provide an ECC engine in the system using memory array 100 to fix errors as appropriate. Generally, a BISTR engine works in conjunction with an ECC engine. Various embodiments of the disclosure use BISTR and ECC engines known in the art.

Margin Low and Margin High

Digital data includes binary logic states, e.g., high (or 1) and low (or 0). Depending on applications a logic state may be based against a reference level (e.g., voltage reference level Vref or resistance reference level Rref, etc.). For example, a resistance is considered high when it is higher than a resistance reference level Rref, and is considered low if it is lower than the resistance reference level Rref. Various embodiments of the disclosure use a margin reference, e.g., a margin low or a margin high reference, based on which the logic state of a resistance (e.g., resistance of the OTP memory) is determined. As a result, a resistance expected to be low is compared against a margin low resistance reference, e.g., Rrefl, and a resistance expected to be high is compared against a margin high resistance reference level, e.g., Rrefh. In various embodiments of the disclosure, the low resistance reference Rrefl is closer to the level of the low state while the high resistance reference is closer to the level of the high state. For example, in an embodiment, a low resistance is about 200 Ohm while a high resistance is about 4K Ohm. Various embodiments of the disclosure set the Rrefl to be about 250 Ohm and the Rrefh to be about 3.8 K Ohm. That is, a resistance is considered low if it is lower than 250 Ohm and is considered high if it is higher than 3.8 K Ohm. Other values of the resistance between 250 Ohm and 3.8 K Ohm is considered invalid. Selecting a margin reference level (e.g., Rrefh or Rrefl) is a design choice and embodiments of the disclosure are not limited to any margin reference level, but are applicable in various design choices.

Method Embodiment

Figure 2B:
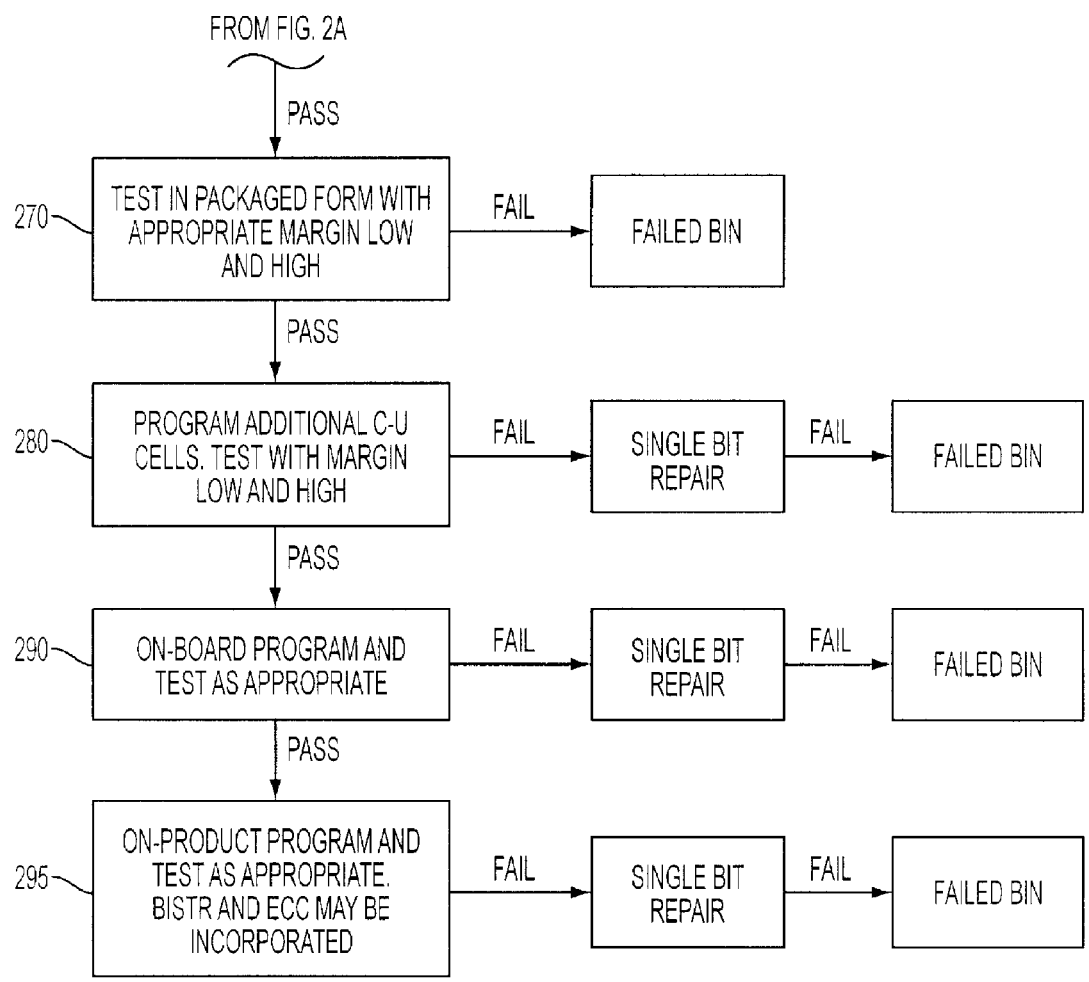

FIG. 2 shows a flow chart illustrating a method embodiment for testing memory array 100. In blocks 210 through 280, if memory array 100 fails any of the test, then it is considered failed and is sent to the failed bin. But if memory array 100 passes the test in a block, it proceeds to be tested in other blocks. In each block 280 to 295 if memory array 100 fails a test in a block, it proceeds to be repaired with a single-bit repair engine. This repair engine can fix multiple bits as appropriate. If the repaired memory array 100 still fails, it is sent to the failed bin. But if the repaired memory array 110 passes, it proceeds to be tested in other blocks. In the tests described below, the term margin low and margin high read tests indicates that cells having low data are verified against a margin low read while cells having high data are verified against a margin high read.

In block 210 because user cells C-U in user section 110-U and test cells C-T in test section 110T are initially low after being manufactured, they are tested with a margin low read.

In block 220 sense amplifiers SA 140 are tested by reading cell resistance in test circuitry 150.

In block 230 cells C-T in test section 110-T are programmed (e.g., written with a high) while cells C-U in user section 110-U remain un-programmed (e.g., stay low). As a result, data in memory array 100 is patterned with a checkerboard. Memory array 100 is then tested with a margin low read for cells C-U and a margin high read for cells C-T.

In various embodiments of the disclosure the logic states of some of the user cells C-U are known in advance of memory array 110 being shipped to a customer. These cells C-U can therefore be programmed and tested. In these situations, in some embodiments of the disclosure, in block 240, those cells in memory array 100 are programmed and tested with a margin low read for cells having low data and a margin high read for cells having high data.

Generally, tests in blocks 210 to 240 are performed at the wafer level, and may be referred to as wafer test or circuit probe test.

In block 250, memory array 100 is subject to a high temperature environment, which in an embodiment is about 150° C.

After being subject to a high temperature environment memory array 100 is retested in block 260 with margin low and high as appropriate.

Tests in blocks 250 and 260 are generally referred to as pre-stress tests.

In various embodiments of the disclosure once memory array 100 passes the above tests in block 210-260, it is packaged, i.e., placed in a semiconductor chip housing having IO pins to interface with other circuitry. Memory array 100 in a package is tested in block 270 with margin low and high as appropriate.

At this time, additional user cells C-U may be programmed (e.g., upon a customer's request, to provide some additional and/or built-in features, etc.). If programmed, memory array 110 is tested in block 280 with margin low and high as appropriate.

Tests in blocks 270 and 280 may be referred to as a final test because after these tests, memory array 100 may be shipped to a customer (e.g., a semiconductor chip retailer).

In various embodiments, memory array 100 in the chip package may be programmed and/or built into a PC board. In this situation, memory array 100 is tested in block 290 with a read margin low and high as appropriate. Test in this block 290 may be referred to as an on-board test.

In various embodiments memory array 100 in the chip package or on a PC board may be programmed and/or built into a product, in which case memory array 100 in block 295 is tested with a margin read of low and high as appropriate. Depending on applications a BSTR engine and an ECC engine are provided to the product (or system) using memory array 100 to fix any erroneous bit if it later arises.

In the above tests, various cells (e.g., cells C-T) of memory array 100 are programmed, verified with a margin low and high read. Cells C-U are also verified with margin low and high. As a result, at least half of the cells of memory array 100 are fully tested. Because programming, verifying low and high logic are involved with related circuitry, passing the above tests is a strong indication that decoders 120-X, 120-Y, control circuit 130, and sense amplifiers 140 are functional.

Because user cells C-U and C-T are configured in a checkerboard pattern, most of user cells C-U are surrounded by four test cells C-T. Because cells C-T are tested and a user cell C-U is surrounded with tested cells it is highly probable that the user cell C-U is functional when the surrounded test cells C-T are functional. With respect to semiconductor manufacturing process, when many test cells C-T (about half of the cells in memory array 100) are good, the process is probably good. If, for example, a large number of test cells C-T are bad, then failure analysis may conclude that the manufacturing process is bad.

A number of embodiments of the disclosure have been described. It will nevertheless be understood that various modifications may be made without departing from the spirit and scope of the invention. For example, cell data in memory array 100 being initially low is for illustration purposes only, embodiments of the invention are applicable where such cell data is initially high. In such situations, subsequent programming to a cell (e.g., a test cell C-T, a user cell C-U, etc.) causes that cell to be low. The above method embodiments show exemplary steps, but they are not necessarily required to be performed in the order shown. Steps may be added, replaced, changed order, and/or eliminated as appropriate, in accordance with the spirit and scope of embodiment of the disclosure.

Each claim of this document constitutes a separate embodiment, and embodiments that combine different claims and/or different embodiments are within scope of the disclosure and will be apparent to those of ordinary skill in the art after reviewing this disclosure.

What is claimed is:

1. A method comprising:
   identifying a first plurality of cells in a one time programming memory array;
   identifying a second plurality of cells in the memory array;
   wherein the first plurality of cells and the second plurality of cells form a checkerboard pattern;
   verifying data in the first plurality of cells and in the second plurality of cells;
   programming the second plurality of cells without programming the first plurality of cells; thereby allowing data in the first plurality of cells and in the second plurality of cells to form the checkerboard pattern; and
   verifying the data in the first plurality of cells and in the second plurality of cells formed as the checkerboard pattern.

2. The method of claim 1 wherein cell data of the memory array is initially low after being manufactured and programming the second plurality of cells causes those cells to be high.

3. The method of claim 1 wherein cell data of the memory array is initially high after being manufactured and programming the second plurality of cells causes the second plurality of cells to be low.

4. The method of claim 1 further providing cells in the memory array to test a sense amplifier of the memory array.

5. The method of claim 4 wherein testing the sense amplifier is based on a predetermined resistance value of the provided cells.

6. The method of claim 1 wherein verifying data in the first plurality of cells and in the second plurality of cells uses at least one of a margin low read, a margin high read or a combination thereof.

7. The method of claim 1 wherein verifying data in the first plurality of cells and in the second plurality of cells is performed in at least one of a wafer test, a pre-high temperature test, a post-high temperature test, a package test, an on-board test, an on-product test or a combination thereof.

8. The method of claim 1 further providing a built-in self-test with a redundant engine to fix a cell in the memory array.

9. The method of claim 1 further providing an error correction code engine to fix a cell in the memory array.

10. A method comprising:
providing a one time programming memory array having a first plurality of cells and a second plurality of cells; the first plurality of cells and the second plurality of cells forming a checkerboard pattern;
verifying data in the first plurality of cells and in the second plurality of cells;
providing at least one cell to test a sense amplifier of the memory array;
programming the second plurality of cells without programming the first plurality of cells; thereby allowing data in the first plurality of cells and in the second plurality of cells to form a checkerboard pattern; and
verifying the data in the first plurality of cells and in the second plurality of cells formed as the checkerboard pattern.

11. The method of claim 10 wherein testing the sense amplifier is based on a resistance value of the at least one cell.

12. The method of claim 10 wherein verifying data in the first plurality of cells and in the second plurality of cells uses one or a combination of a margin low or a margin high read.

13. The method of claim 10 wherein data in the first plurality of cells and in the second plurality of cells are initially at a same logic level.

14. The method of claim 10 further programming at least one cell of the first plurality of cells when data of the at least one cell of the first plurality of cells is known in advance, and then testing the memory array with at least one of a margin low read, a margin high read or a combination thereof.

15. A method comprising:
providing a one time programming memory array having a first plurality of cells and a second plurality of cells, the first plurality of cells and the second plurality of cells form a checkerboard pattern, data in the first plurality of cells and in the second plurality of cells having a same first logic level;
verifying the data in the first plurality of cells and in the second plurality of cells;
programming the second plurality of cells, thereby causing data in the second plurality of cells to have a second logic level, the first logic level in the first plurality of cells and the second logic level in the second plurality of cells form the checkerboard pattern;
verifying the data formed as the checkerboard pattern.

16. The method of claim 15 further providing at least one cell used to test a sense amplifier of the memory array.

17. The method of claim 16 wherein testing the sense amplifier is based on a resistance value in the at least one cell.

18. The method of claim 15 further programming at least one cell of the first plurality of cells and verifying data then in the memory array.

19. The method of claim 15 wherein verifying data in the memory array is performed in at least one of a wafer test, a pre-high temperature test, a post-high temperature test, a package test, an on-board test, an on-product test or a combination thereof.

20. The method of claim 15 wherein verifying the data in the first plurality of cells and in the second plurality of cells and verifying the data formed as the checkerboard pattern use a margin low read, a margin high read or a combination thereof.

* * * * *